United States Patent
Ma et al.

(10) Patent No.: US 9,985,667 B1
(45) Date of Patent: May 29, 2018

(54) INTER-BAND CA DIGITAL TRANSMITTER WITH MULTI-STAGE OUT-OF-BAND NOISE CANCELLER

(71) Applicant: Mitsubishi Electric Research Laboratories, Inc., Cambridge, MA (US)

(72) Inventors: Rui Ma, Lexington, MA (US); SungWon Chung, Los Angeles, CA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days. days.

(21) Appl. No.: 15/494,610

(22) Filed: Apr. 24, 2017

(51) Int. Cl.
| | |
|---|---|
| *H04L 25/49* | (2006.01) |
| *H04B 1/04* | (2006.01) |
| *H04L 27/12* | (2006.01) |
| *H04W 84/04* | (2009.01) |

(52) U.S. Cl.
CPC ......... *H04B 1/0475* (2013.01); *H04L 27/122* (2013.01); *H04B 2001/0408* (2013.01); *H04B 2001/0491* (2013.01); *H04W 84/042* (2013.01)

(58) Field of Classification Search
CPC .......... H04B 1/0475; H04B 2001/0408; H04B 2001/0491; H04L 27/122; H04W 84/042
See application file for complete search history.

(56) References Cited

U.S. PATENT DOCUMENTS

| | | | |
|---|---|---|---|
| 6,321,075 | B1 | 11/2001 | Butterfield |
| 7,262,658 | B2 | 8/2007 | Ramaswamy et al. |
| 7,826,553 | B2 | 11/2010 | Chen et al. |
| 8,169,272 | B2 | 5/2012 | Chen et al. |
| 8,831,085 | B2 | 9/2014 | Hezar et al. |
| 8,873,611 | B2 | 10/2014 | Hori et al. |

(Continued)

OTHER PUBLICATIONS

K. Hausmair, S. Chi, and P. Singerl, and C. Vogel, "Aliasing-free digital pulse-width modulation for burst-mode RF transmitters," IEEE Transaction on Circuits and Systems I, vol. 60, No. 2, pp. 415-427, Dec. 2012.

(Continued)

*Primary Examiner* — Syed Haider
(74) *Attorney, Agent, or Firm* — Gene Vinokur; James McAleenan; Hironori Tsukamoto (57) ABSTRACT

A radio frequency transmitter for wireless communication includes a plurality of input ports to receive a plurality of sequences of baseband symbols to be transmitted on a plurality of disjoint frequency bands, a power encoder to modulate and encode the plurality of sequences of baseband symbols to produce an encoded multi-band signal including the plurality of disjoint frequency bands carrying the plurality of sequences of baseband symbols, a first power amplifier for amplifying the encoded multi-band signal to produce an amplified encoded multi-band signal, a first noise canceller to generate a first noise mitigation signal from the encoded multi-band signal and the plurality of sequences of baseband symbols, a first power combiner to combine the amplified encoded multi-band signal and the first noise mitigation signal to produce an RF multi-band signal, and an antenna for transmitting the RF multi-band signal.

15 Claims, 7 Drawing Sheets

(56) References Cited

U.S. PATENT DOCUMENTS

| | | | |
|---|---|---|---|
| 8,953,670 B1* | 2/2015 | Ma | H04B 1/0475 327/31 |
| 8,957,727 B2 | 2/2015 | Dawson et al. | |
| 9,065,508 B2 | 6/2015 | Baudin et al. | |
| 9,197,465 B2 | 11/2015 | Ma et al. | |
| 9,203,559 B2 | 12/2015 | Wang et al. | |
| 9,220,106 B2 | 12/2015 | Kahrizi et al. | |
| 9,252,718 B2 | 2/2016 | Laporte et al. | |
| 9,294,079 B1* | 3/2016 | Ma | H03K 7/08 |
| 2005/0053097 A1* | 3/2005 | Djokovic | H04B 3/32 370/497 |
| 2015/0117512 A1* | 4/2015 | Ma | H03F 1/3247 375/238 |
| 2016/0028565 A1* | 1/2016 | Koike-Akino | H04L 25/4902 375/238 |
| 2016/0087658 A1* | 3/2016 | Weissman | H04B 1/10 455/78 |
| 2016/0285484 A1 | 9/2016 | Weissman et al. | |
| 2016/0380681 A1 | 12/2016 | Sahota | |

OTHER PUBLICATIONS

R. F. Cordeiro, A. S. R. Oliveira, and J. M. N. Vieira, "All-digital transmitter with a mixed-domain combination filter," IEEE Transaction on Circuits and Systems II, vol. 63, No. 1, p. 4-8, Jan. 2016.

M. Tanio, S. Hori, N. Tawa, T. Yamase, and K. Kunihiro, "Am FPGA-based all-digital transmitter with 28-GHz time-interleaved delta-sigma modulation," Proceedings of 2016 IEEE International Microwave Symposium, pp. 1-4, May 2016.

Chung et al. "Inter band Carrier Aggregation Digital Transfer with Concurrent Multi-band delta-sigma modulation using out of band noise cancellation," 2015 IEEE MIT S international microwave symposium, May 17, 2015, pp. 1-4.

Pham et al. "Multi stage noise band cancellation and Sigma Delta modulator for digitisation of distorted signals," Electronics Let, IEEE, Vol. 48, No. 10, May 10, 2012.

* cited by examiner

INTER-BAND CA DIGITAL TRANSMITTER WITH MULTI-STAGE OUT-OF-BAND NOISE CANCELLER

FIELD OF THE INVENTION

This invention relates to an inter-band carrier aggregation (CA) digital transmitter, and more specifically to an inter-band CA digital transmitter with a multi-stage out-of-band noise canceller.

BACKGROUND OF THE INVENTION

A radio frequency (RF) digital transmitter (DTX) for wireless communication has several advantages compared to the conventional wireless transmitters consisting of a digital baseband followed by an analog/RF front-end. The DTX shifts the digital-analog interface close to the antenna, and thus fewer analog components are involved. The DTX also enhances system flexibility through multi-mode and multi-band operation enabled by digital signal processing. Thus, the DTX has benefits for both wireless base-station and mobile applications.

In order to increase a wireless data rate and to improve network coverage with the efficient use of spectrum, concurrent multi-band (CMB) transmission methods have been developed. For example, the long-term evolution (LTE) communication standard defines non-contiguous inter-band carrier aggregation (IB-CA) for concurrently transmitting and receiving multiple disjoint frequency bands between a transmitter and a receiver. Recently, there have been growing interests on IB-CA DTX for non-contiguous CMB transmission, for which system designers are faced with significant challenges in experimental realization.

Delta-sigma modulation based CMB (CMB-DSM) technique allows IB-CA DTX to achieve an excellent dynamic range without spurious tones, but CMB-DSM technique suffers from a large amount of out-of-band noise.

Although a noise cancellation technique was discussed on an IB-CA DTX with non-contiguous CMB-DSM in U.S. Pat. No. 9,294,079, the suppression of out-of-band noise is not sufficient to eliminate the need of a high-order multi-band RF output filter (MB-RFOF) or significantly relax the MB-RFOF design requirements.

Accordingly, there is a need to realize a radio frequency (RF) digital transmitter with a noise canceller for sufficiently reducing the out-of-band noise without using MB-RFOFs.

SUMMARY OF THE INVENTION

Some embodiments are based on recognition of the fact that noise signals of the wireless communication can be realized by a radio frequency (RF) transmitter that includes a plurality of input ports to receive a plurality of sequences of baseband symbols to be transmitted on a plurality of disjoint frequency bands; a power encoder to modulate and encode the plurality of sequences of baseband symbols to produce an encoded multi-band signal including the plurality of disjoint frequency bands carrying the plurality of sequences of baseband symbols; a first power amplifier for amplifying the encoded multi-band signal to produce an amplified encoded multi-band signal; a first noise canceller to generate a first noise mitigation signal from the encoded multi-band signal and the plurality of sequences of baseband symbols; a first power combiner to combine the amplified encoded multi-band signal and the first noise mitigation signal to produce an RF multi-band signal; and an antenna for transmitting the RF multi-band signal.

Further, some embodiments are based on recognition and appreciation of the fact that the noise signals of the wireless communication are reduced by a noise mitigation device. Accordingly, one embodiment discloses a noise mitigation device for generating a noise mitigation signal. The noise mitigation device includes a dual-band quadrature modulator to modulate a plurality of sequences of baseband symbols into a predetermined carrier frequency signal using digital up-conversion mixing; a first digital adder to combine the predetermined carrier frequency signal and an encoded multi-band signal including a plurality of disjoint frequency bands carrying the plurality of sequences of baseband symbols and generate a first combined signal; a first digital gain unit to control the first combined signal of the first digital adder in a predetermined output range; a first coarse quantizer to quantize the first combined signal from the first digital gain unit into a first quantized signal having first predetermined bits; and a first power amplifier to amplify the first quantized signal and transmit the amplified first quantized signal as a first noise mitigation signal.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and sprit of the principles of the presently disclosed embodiments.

DETAILED DESCRIPTION OF THE PREFERRED EMBODIMENTS

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process, which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

According to embodiments of the present disclosure, a non-contiguous inter-band carrier aggregation digital transmitter (IB-CA DTX) is provided without a multi-band RF output filter (MB-RFOF).

Figure 1:
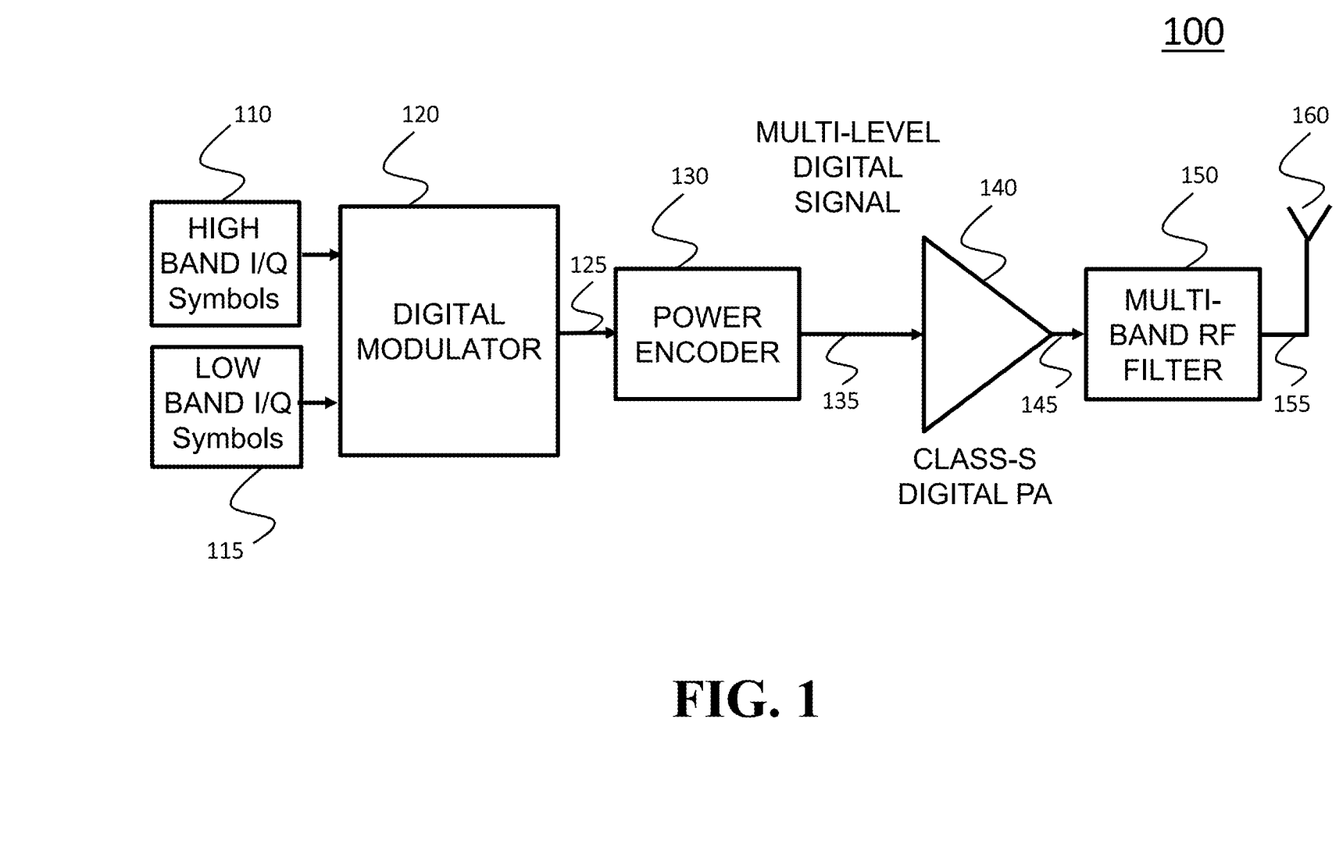
FIG. 1 is a block diagram of an inter-band CA digital transmitter (IB-CA DTX)
Figure 2:
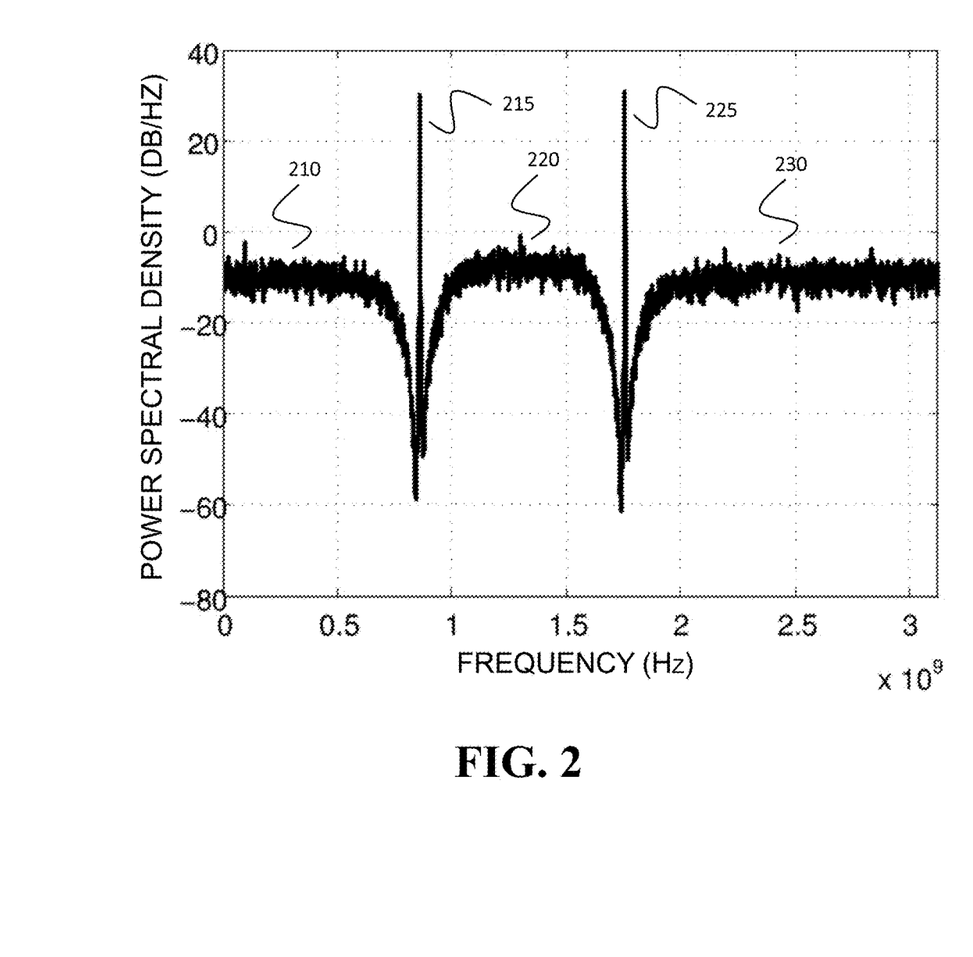
FIG. 2 is a simulation result on the output spectrum of an IB-CA DTX.

The present disclosure will discuss on multi-stage noise shaping (MASH) techniques for delta-sigma modulation (DSM) to refer issues of the MASH techniques with respect to out-of-band noises using FIG. 1 and FIG. 2.

FIG. 1 shows a block diagram of an inter-band carrier aggregation digital transmitter (IB-CA DTX) 100. The IB-CA-DTX 100 includes input ports for receiving high band inphase/quadrature phase (I/Q) symbols 110 and low band I/Q symbols 115, a digital modulator 120, a power encoder 130, a Class-S digital power amplifier (PA) 140, a multi-band RF filter 150 and a transmit antenna 160.

The IB-CA-DTX 100 converts the sequence of high band I/Q symbols 110 and low band I/Q symbols 115 into a sequence of high-resolution digital RF signal 125 by using a digital modulator 120.

The digital modulator 120 receives the high band I/Q symbols 110 and low band I/Q symbols via two input ports and transmits the high-resolution digital RF signals 125 to the power encoder 130 after a signal conversion process. The power encoder 130 converts the sequence of high-resolution digital RF signal 125 into a low-resolution digital RF signal (multi-level digital signal) 135.

The power encoder 130 includes circuitry modules of delta-sigma modulation (DSM), pulse-width modulation (PWM), pulse-position modulation (PPM), and outphasing modulation.

The class-S DPA (Digital Power Amplifier) 140 has an input matching network (not shown) with wide bandwidth while having an output matching network with narrow bandwidth such that high-efficiency class-S operation can be achieved. For high power-efficiency, the class-S DPA 140 is implemented in compound semiconductor such as GaN HEMTs and InGaAs HBTs.

The multi-band RF output filter (MRFOF) 150 attenuates the out-of-band emission from the class-S DPA 140. Although the transmit antenna 160 provides additional out-of-band attenuation, in order to meet the transmit spectrum mask required by wireless communication standards, further noise reduction will be necessary. Because the MRFOF 150 handles the class-S DPA output 145, the insertion loss should be minimized. Therefore, one design goal of the power encoder 130 is to minimize the out-of-band emission so that a low-order MRFOF with a low insertion loss can be used.

In order to eliminate the MB-RFOF from IB-CA DTX or to replace the MB-RFOF with a single or two-pole low-pass RF filter, the IB-CA DTX may use a noise cancellation (NC) technique. Some embodiments of the present disclosure are based on recognition of the fact that the MSOB-NC that can achieve a significant amount of out-of-band noise cancellation with a non-contiguous IB-CA DTX based on CMB-DSM.

In multi-level CMB-DSM, the MSOB-NC generates an anti-phased out-of-band quantization noise, which is added to the Class-S digital power amplifier (DPA) output by an asymmetric power combiner (APC). Compared to conventional symmetric Wilkinson power combiner, APC achieves the noise cancellation with higher power efficiency.

In accordance with embodiments of the present disclosure, the design considerations with MSOB-NC is on the number of stages and the resolution of a quantizer in each stage. Theoretically, two-stage MSOB-NC can achieve perfect noise cancellation using a high resolution quantizer and a high-resolution RF DAC. By selecting the quantizer resolution to 2-3 bits, RF DAC design can be relaxed. By adding an extra stage of noise canceller, excellent noise cancellation performance can be achieved with a low-resolution quantizer.

Further, a modular implementation of an out-of-band noise canceller can be cascaded into a multi-stage architecture by concatenating the same noise canceller. In this case, a multi-stage implementation of OB-NC can save power consumption compared to a single-stage OB-NC implementation with a high-resolution quantizer. For example, a single-stage OB-NC with a 10-bit quantizer is equivalent to a two-stage OB-NC each with 5-bit quantizer. This means that instead of a single 10-bit digital-to-analog converter (DAC) for creating a noise cancellation signal, the two-stage OB-NC uses two 5-bit DACs. The power consumption of two 5-bit DACs is significantly smaller than a single 10-bit DAC because increasing 1-bit resolution typical requires 4 times more power consumption.

According to embodiments of the present disclosure, MSOB-NC with non-contiguous IB-CA DTX does not limit the simultaneous application of in-band noise suppression technique. Thus, IB-CA DTX can be designed with both in-band noise suppression and out-of-band noise cancellation, which may improve in-band SNR and relax the RF output filter requirement at the same time.

FIG. 2 shows a simulation result on the output spectrum obtained at an output port 155 of the MRFOF 150 in the IB-CA DTX 100. The class-S DPA 140 concurrently transmits a low band channel 215 and a high band channel 225. As indicated in the figure, noise levels are reduced in-band regions of the low band channel 215 and the high band channel 225 by the MRFOF 150. However, the out-of-band emissions 210, 220 and 230 still need further attenuation to improve the SNR.

Accordingly, some embodiments of the present disclosure provide a system and method to significantly reduce the out-of-band emission 210, 220, 230 while reducing the design complexity and the insertion loss of the MRFOF 150. In some embodiments of the present disclosure, the MRFOF 150 can be omitted from the IB-CA-DTX 100.

According to embodiments of the present disclosure, a radio frequency (RF) transmitter for wireless communication includes a plurality of input ports to receive a plurality of sequences of baseband symbols to be transmitted on a plurality of disjoint frequency bands, a power encoder to modulate and encode the plurality of sequences of baseband symbols to produce an encoded multi-band signal including the plurality of disjoint frequency bands carrying the plurality of sequences of baseband symbols, a first power amplifier for amplifying the encoded multi-band signal to produce an amplified encoded multi-band signal, a first noise canceller to generate a first noise mitigation signal from the encoded multi-band signal and the plurality of sequences of baseband symbols, a first power combiner to combine the amplified encoded multi-band signal and the first noise mitigation signal to produce an RF multi-band signal, and an antenna for transmitting the RF multi-band signal. Examples of the configuration above will be discussed using the following figures.

Figure 3:
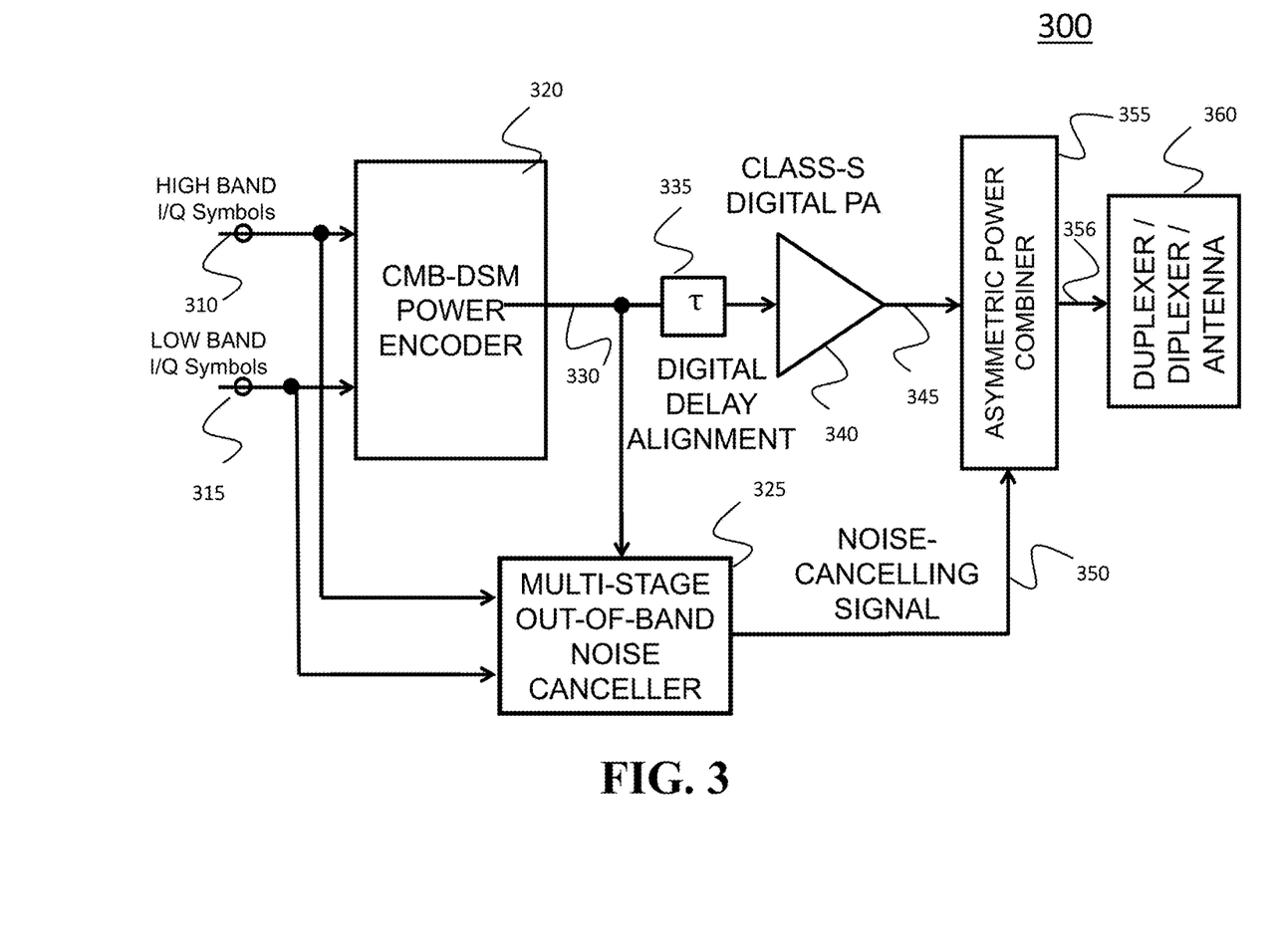
FIG. 3 is a block diagram of an IB-CA DTX having a multi-stage out-of-band noise canceller (MSOB-NC), according to embodiments of the present disclosure.

FIG. 3 shows a block diagram of an IB-CA DTX 300 according to embodiments of the present disclosure. The IB-CA DTX 300 includes a concurrent-multiband delta-sigma modulation (CMB-DSM) power encoder 320, a multi-stage out-of-band noise canceller (MSOB-NC) 325, a digital delay unit (circuitry) 335, a class-S digital PA 340, an asymmetric power combiner 355 and a duplexer/diplexer antenna 360. The MSOB-NC 325 can be formed by one or more than one stages of out-of-band noise cancellers (circuitries).

The power encoder 320 encodes input symbols (signals) based on concurrent-multiband delta-sigma modulation (CMB-DSM). In this case, the power encoder 320 converts input signals containing sequences of high band I/Q symbols 310 and low band I/Q symbols 315 into a sequence of a low resolution digital RF symbol 330. The low resolution digital RF symbol 330 is transmitted to the digital delay unit 335 and the MSOB-NC 325.

The MSOB-NC 325 compares the high band I/Q symbols 310 and low band I/Q symbols 315 with the low-resolution digital RF symbol 330 received from the CMB-DSM power encoder 320, and creates a noise cancelling signal 350. A noise cancelling signal may be referred to as a noise mitigation signal.

For instance, the MSOB-NC 325 transforms the low resolution digital RF symbol 330 to have an opposite sign based on an inverse operation and combines the opposite signed low resolution digital RF symbol with the sequences of the high band I/Q symbols 310 and low band I/Q symbols 315. The transformed low resolution digital RF symbol may be referred to as an opposite signed low resolution digital RF symbol 330' (not shown). In this case, the opposite signed low resolution digital RF symbol 330' includes an opposite signed signal component of the sequences of the high and low band I/Q symbols 310 and 315 and an opposite signed noise component of a noise signal caused by the CMB-DSM power encoder 320.

Accordingly, when the opposite signed low resolution digital RF symbol 330' is added (combined) with the sequences of the high and low band I/Q symbols 310 and 315, the opposite signed noise component with respect to the noise signal caused by the CMB-DSM power encoder 320 can be extracted (obtained). As a result, the noise cancelling signal 350 includes the opposite signed noise component of the noise signal caused by the CMB-DSM power encoder 320.

An output 345 of the class-S digital PA includes the sequence of a low resolution digital RF symbol 330 and a noise signal generated by the CMB-DSM power encoder 320, when the output 345 is combined with the noise cancelling signal 350 by the APC 355, the noise component of the noise signal caused by the CMB-DSM power encoder 320 can be substantially reduced without affecting the signal component of the sequence of a low resolution digital RF symbol 330.

In this process, the MSOB-NC 325 can perform the comparison either the down-conversion of the low-resolution digital RF symbol 330 or the up-conversion of the two sequences of baseband IQ symbols. As this conversion introduces time delay, the noise cancelling signal 350 includes a time delay behind the class-S DPA.

The digital delay unit 335 is configured to align the noise cancellation signal 350 with the output 345 of the class-S DPA 340 by applying a predetermined delay time to the low-resolution digital RF symbol 330 such that the time delay introduced by the MSOB-NC 325 is compensated. Because the time delay is fixed (a constant value) and accurately defined by a digital clock, calibration of the time delay 335 is not necessary. From the design of the MSOB-NC 325, the time delay at the digital delay unit 335 can have a fixed design so that a simple implementation using a flip-flop based register file is allowed.

Similar to the class-S DPA 140, as discussed in FIG. 2, the output 345 of the class-S DPA 340 includes concurrent dual-band channels (channel signals) 215, 225 as well as undesirable out-of-band emission (signal levels) 210, 220, 230 before entering the APC 355. It should be noted that the APC 355 can combine signals having different power levels. When the noise cancelling signal 350 is combined with the output 345 of the class-S DPA 340 by the APC 355, the out-of-band emissions 210, 220, 230 can substantially be reduced, which will be discussed in FIG. 4.

According to embodiments of the present disclosure, the output 356 (APC output 356) of the APC 355 can be directly connected to a duplexer, a diplexer, or an antenna 360 because the noise cancellation is sufficiently applied to the APC output 356. This circuit configuration can provide remarkable advantages for improving the SNR characteristics and simplifying the IB-CA DTX circuits.

Figure 4:
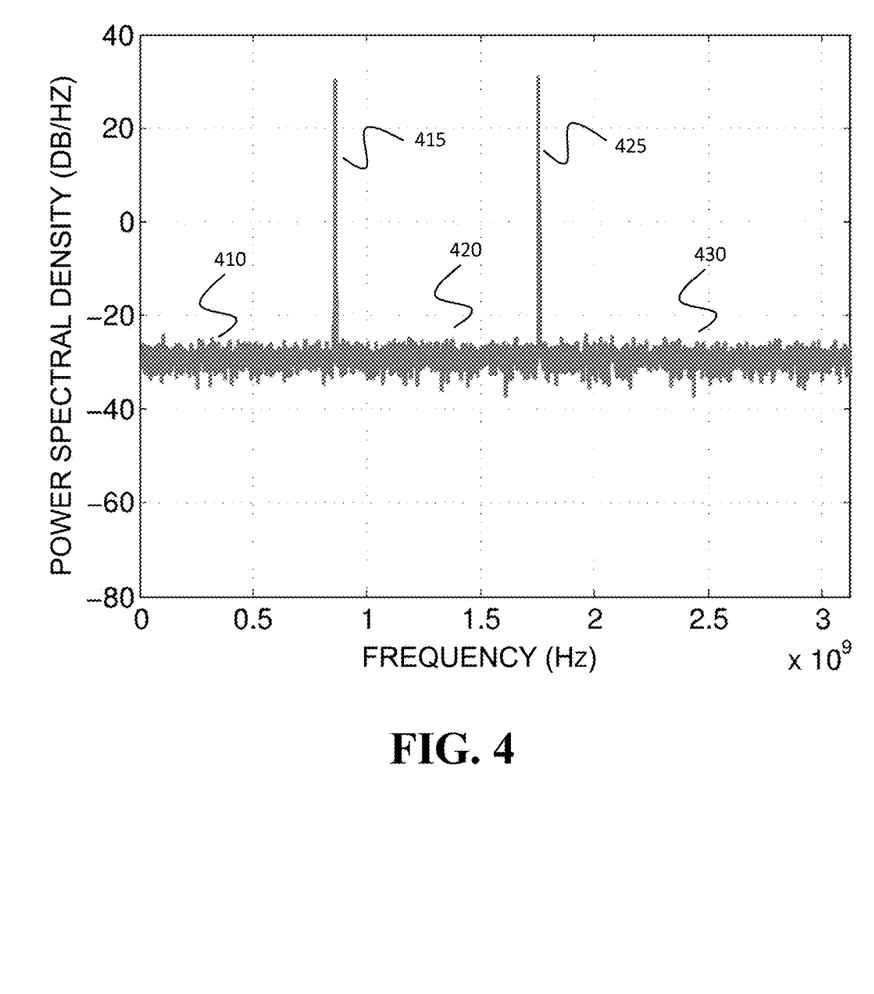
FIG. 4 is a simulation result on the output spectrum of an IB-CA DTX with a MSOB-NC, according to embodiments of the present disclosure.

FIG. 4 is an experimental result indicating a simulation result on the output spectrum at an output port 356 of the APC 355 in the IB-CA DTX 300, according to embodiments of the present disclosure. It is seen that the class-SDPA 340 concurrently transmits a low band channel 415 and a high band channel 425. Compared to the out-of-band emissions 210, 220, 230 in FIG. 2, the out-of-band emissions 410, 420, 430 is substantially suppressed by the noise cancelling signal 350 generated by the MSOB-NC 325. The nose is lowered by approximately 20 dB, resulting an excellent SNR as indicated in the figure.

As illustrated in FIG. 3, the IB-CA DTX 300 includes a single stage of the MSOB-NC 325, however, by using a two-stage or a three-stage MSOB-NC, the amount of noise suppression effect can be further improved, so that the APC 355 can drive either a duplexer, a diplexer, or an antenna 360 without an MRFOF (Multi-Band RF Filter) at the output of the APC 355, in contrast to the case of FIG. 1. Further, in some cases, depending on communication standard requirements on transmit spectral mask, an additional MRFOF (not shown) may be added between the asymmetric power combiner 355 and the duplexer/diplexer/antenna 360 in the IB-CA DTX 300, but the complexity and the insertion loss of the MRFOF can be remarkably reduced thanks to the suppression of the out-of-band emission by the MSOB-NC 325.

The multi-stage out-of-band noise canceller (MSOB-NC) in FIG. 3 will be discussed below in more detail using FIG. 5. It should be noted that the identical components shown in FIG. 3 are labeled with different numbers for convenience of explanation.

Figure 5:
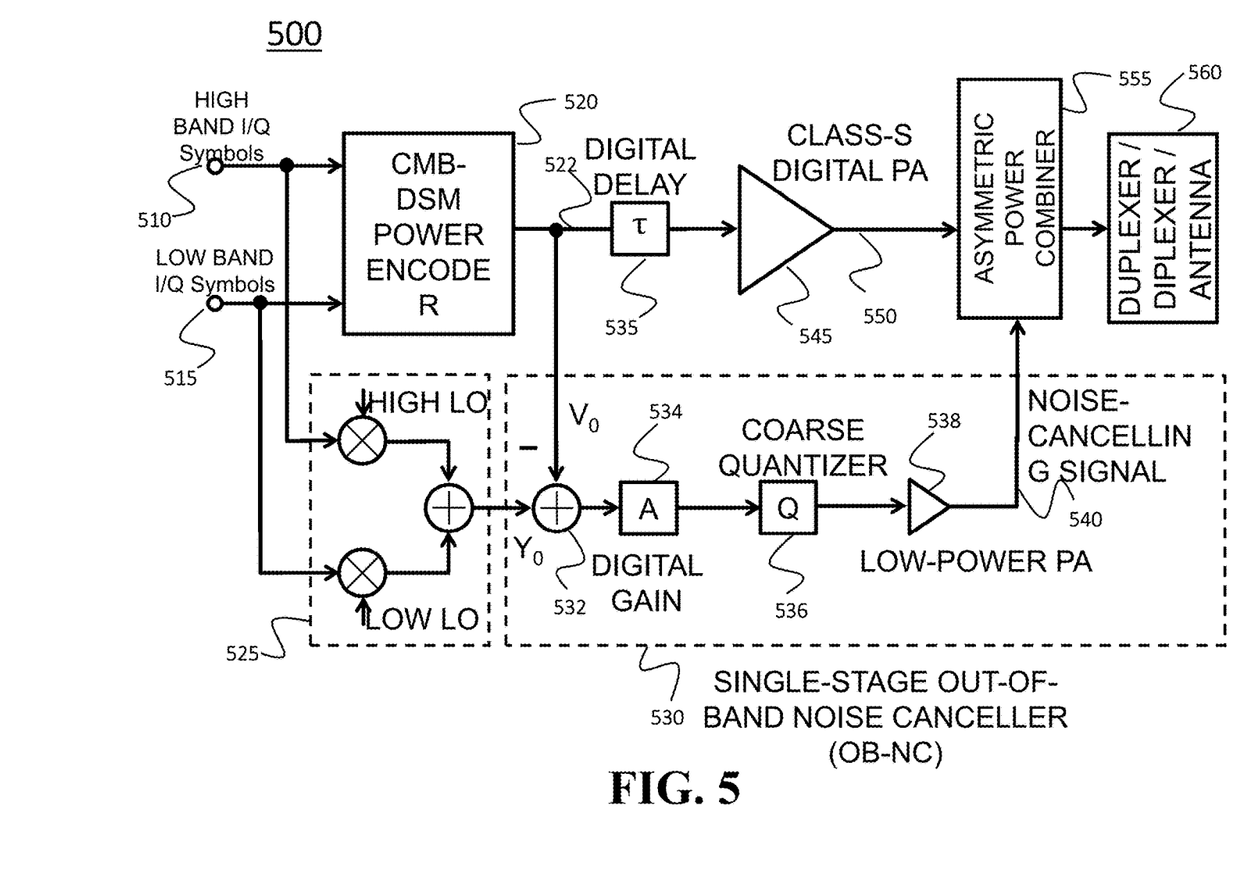
FIG. 5 is a single-stage implementation of MSOB-NC, according to embodiments of the present disclosure.

FIG. 5 shows a block diagram of an IB-CA DTX 500 according to embodiments of the present disclosure. The IB-CA DTX 500 includes a CMB-DSM power encoder 520, a dual-band digital quadrature modulator (DB-DQM) 525, a MSOB-NC 530, a digital delay unit 535, a class-S digital PA 545, an asymmetric power combiner 555 and a duplexer/diplexer antenna 560. The operations of the multi-stage out-of-band noise canceller discussed in FIG. 3 are described in more detail using the DB-DQM 525 and the MSOB-NC 530. The MSOB-NC 530 includes a single OB-NC, which can be referred to as a single-stage out-of-band noise canceller 530 (single-stage OB-NC 530). The MSOB-NC 530 includes a digital adder 532, a digital gain unit 534, a coarse quantizer 536, and a low-power PA 538, in which the digital gain unit 534 and the coarse quantizer 536 may be formed of digital logic circuits.

The dual-band digital quadrature modulator (DB-DQM) 525 modulates the baseband I/Q symbols of a high band 510 and the baseband I/Q symbols of a low band 515 into a corresponding carrier frequency signal $Y_0$ using digital up-conversion mixing (digital up-conversion mixing method). The hardware implementation of the digital mixing includes a multiplier, which introduces a time delay.

The single-stage OB-NC 530 generates the noise cancelling signal 540 by comparing the multi-band baseband symbols (modulated high and low band I/Q symbols) 510, 515 with the low-resolution digital RF symbol 522 (output $V_0$) generated by the CMB-DSM power encoder 520. The OB-NC 530 first compares the output $V_0$ of the CMB-DSM power encoder 520 with the output $Y_0$ from the DB-DQM 525 using the digital adder 532. For instance, the digital adder 532 transforms the low-resolution digital RF symbol 522 to have an opposite sign by an inverse operation, resulting in an opposite signed low-resolution digital RF symbol. This transformation (inverse operation) is indicated by a minus sign in the figure.

The opposite signed low-resolution digital RF symbol includes the signal components of the modulated high and low band I/Q symbols 510 and 515 with the opposite sign and includes an opposite noise component with respect to a noise signal caused by the CMB-DSM power encoder 520.

As the output signal $Y_0$ includes the signal components of the high and low baseband I/Q symbols 510 and 515, an opposite signed noise component of the opposite signed output 522 can be obtained when the opposite signed low-resolution digital RF symbol 522' is added to the output signal at the digital adder 532. Accordingly, the noise cancelling signal 540 includes the opposite signed noise component with respect to the low-resolution digital RF symbol 522.

A digital gain of a digital gain unit 534 is chosen for the quantizer 536 such that the output of the digital adder 532 is controlled in a predetermined input range of the quantizer 536 for avoiding the overflow of data to the quantizer 536. The gain of the lower power PA 538 is chosen such that the noise cancellation can be maximized. In this case, the output power of the class-S digital PA 545 is greater than the output power of the low-power PA 538. Further a resolution of the lower power PA 538 is greater than a resolution of the class-S digital PA 545. The noise cancelling signal 540 is transmitted to the asymmetric power combiner 555, so that the noise signals of the output signal 550 from the class-S digital PA 545 are substantially reduced (compensated) by being combined with the noise cancelling signal 540. Noise cancelled signals are transmitted to the duplexer/diplexer antenna 560 from the asymmetric power combiner 555. In some cases, a multi-band RF filter (not shown) may be added between the asymmetric power combiner 555 and the duplexer/diplexer antenna 360 according to the requirements of a circuit design.

In accordance with embodiments of the present disclosure, a noise mitigation device for generating a noise mitigation signal includes a dual-band quadrature modulator to modulate a plurality of sequences of baseband symbols into a predetermined carrier frequency signal using digital up-conversion mixing, a first digital adder to combine the predetermined carrier frequency signal and an encoded multi-band signal including a plurality of disjoint frequency bands carrying the plurality of sequences of baseband symbols and generate a first combined signal, a first digital gain unit to control the first combined signal of the first digital adder in a predetermined output range, a first coarse quantizer to quantize the first combined signal from the first digital gain unit into a first quantized signal having first predetermined bits, and a first power amplifier to amplify the first quantized signal and transmit the amplified first quantized signal as a first noise mitigation signal.

In accordance with embodiments of the present disclosure, a noise mitigation device for generating a noise mitigation signal includes a dual-band quadrature modulator to modulate a plurality of sequences of baseband symbols into a predetermined carrier frequency signal using digital up-conversion mixing, a first digital adder to combine the predetermined carrier frequency signal and an encoded multi-band signal including a plurality of disjoint frequency bands carrying the plurality of sequences of baseband symbols and generate a first combined signal, a first digital gain unit to control the first combined signal of the first digital adder in a predetermined output range, a first coarse quantizer to quantize the first combined signal from the first digital gain unit into a first quantized signal having first predetermined bits, and a first power amplifier to amplify the first quantized signal and transmit the amplified first quantized signal as a first noise mitigation signal.

In some case, the digital adder transforms the encoded multi-band signal into an opposite signed encoded multi-band signal having an opposite sign by an inverse operation before combining with the predetermined carrier frequency signal.

Further, the noise mitigation device may include a first digital delay unit disposed between the first coarse quantizer and the first power amplifier, wherein the first digital delay unit adds a predetermined delay time to the first quantized signal, a second-stage noise canceller to generate a second noise mitigation signal. In this case, the second-stage noise canceller includes a second digital adder to combine an output signal of the first digital gain unit and the first quantized signal and to generate a second combined signal, a second digital gain unit to control the second combined signal from the first digital adder in a second predetermined output range, a second coarse quantizer to quantize the second combined signal from the second digital gain unit into a second quantized signal having second predetermined bits, a second power amplifier to amplify the second quantized signal and transmit the amplified second quantized signal as a second noise mitigation signal, and an asymmetric power combiner to combine the first and second noise mitigation signals. An example of the configuration above will be discussed using FIG. 6.

Figure 6:
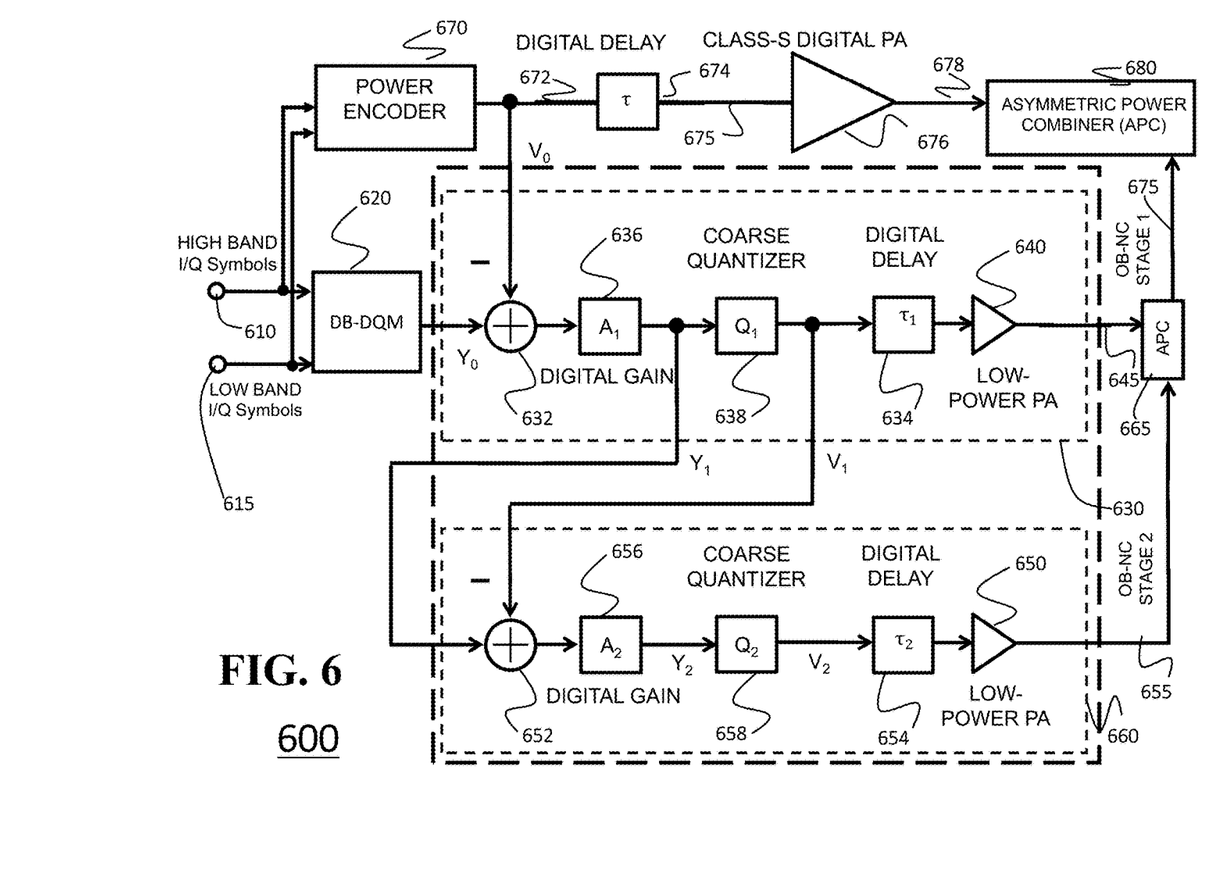
FIG. 6 is a two-stage implementation of MSOB-NC, according to embodiments of the present disclosure.

FIG. 6 shows the block diagram of a two-stage implementation of a MSOB-NC 600 according to embodiments of the present disclosure. The two-stage implementation of the MSOB-NC 600 is performed by using a dual-band digital quadrature modulator 620 (DB-DQM 620), a low-power APC 665 a CMB-DSM power encoder 670, a digital delay unit 674, a class-S digital PA 676 (main class-S digital power amplifier) and a main APC 680.

The MSOB-NC 600 includes a first stage OB-NC 630 and a second stage OB-NC 660. An output of the main APC 680 is connected to a duplexer/diplexer antenna (not shown) to transmit noise cancelled signals.

The digital delay unit 674 and the class-S digital PA 676 are used to manipulate the signal 672 generated by 670. The digital delay unit 674 generates a predetermined delayed signal 675 and applied to an output signal 672 of the CMB-DSM power encoder 670 to align with the nose cancellation signal 675 from the low-power APC 665. The delayed signal 675 is then amplified by digital PA 676 with enhanced amplitude signal of 678, which is combined with signal 675 at the APC 680.

The MSOB-NC 600 generates a noise cancellation signal 675 by comparing the multi-band baseband I/Q symbols 610, 615 with a low-resolution digital RF symbols $V_O$ generated by the CMB-DSM power encoder 670. The first stage OB-NC 630 includes a digital adder 632, a digital gain unit 636, a coarse quantizer 638, a digital delay unit 634 and a low-power PA 640, in which the digital delay unit 634, the digital gain unit 636 and the coarse quantizer 638 may be formed of digital logic circuits. Further, the second stage OB-NC 660 includes a digital adder 652, a digital gain unit 656, a coarse quantizer 658, a digital delay unit 654 and a low-power PA 650, in which the digital delay unit 654, the digital gain unit 656 and the coarse quantizer 658 may be formed of digital logic circuits. Further, as a process of the digital delay unit 654 is performed for a following stage of MSOB-NC, the process of the digital delay unit 654 can be skipped or the digital delay unit 654 can be omitted when the MSOB-NC includes only two stages of OB-NCs.

Except the digital delay unit (circuitry) 634, the first stage OB-NC 630 operates in the same way as the single-stage OB-NC 530 in FIG. 5. The digital delay unit 634 delays the output 645 of the first stage OB-NC 630 such that the output 645 aligns with the output 655 of the second stage OB-NC output 660.

The second stage OB-NC 660 reduces a quantization noise caused from the first stage OB-NC 630. As the quantization noise is caused at the coarse quantizer 638, a signal output $Y_1$ from the digital gain unit 636 before entering the coarse quantizer 638 and a signal output $V_1$ from the coarse quantizer 638 are used (added) at the digital adder 652 of the second stage OB-NC 660 to extract a quantization noise component as an opposite signed quantization noise component from signals of the first stage OB-NC 630. At the digital adder 652, the signal output $V_1$ is converted to have negative signs and added with the signal output of $Y_1$. As the signal $Y_1$ does not include a noise component caused by the coarse quantizer 638, the opposite signed noise component of the quantization noise can be obtained after the processing at the digital adder 652. The opposite signed noise component is processed through the digital gain unit 656, the coarse quantizer 658, the digital delay unit 654 and the low-power PA 650, and becomes a quantization noise cancelling signal output 655. The quantization noise cancelling signal output 655 can be referred to as a second output 655.

The second stage OB-NC 660 introduces additional time delay because a high-speed implementation of digital arithmetic operation such as digital gain 656 and coarse quantizer 658 may be performed by a pipelined digital logic (not shown). If the low-power PA 650 requires a digital-to-analog converter (DAC) process to interface with the quantizer 658, the DAC process also introduces an additional time delay. Both the digital delay and the analog delay caused at the second stage OB-NC 660 are calibrated by the digital delay unit 634 of the first stage OB-NC 630.

The low-power APC 665 combines the first output 645 of the first stage OB-NC 630 with the second output 655 of the second stage OB-NC 660. As a result, the low-power APC 665 transmits an output 675 that can achieve more effective noise cancellation with the output signal 678 of the main Class-S DPA (676 when combined at the APC 680. Further, the noise cancelled signal (not shown) at the APC 680 is driven and output from the main high-power APC 680.

Figure 7:
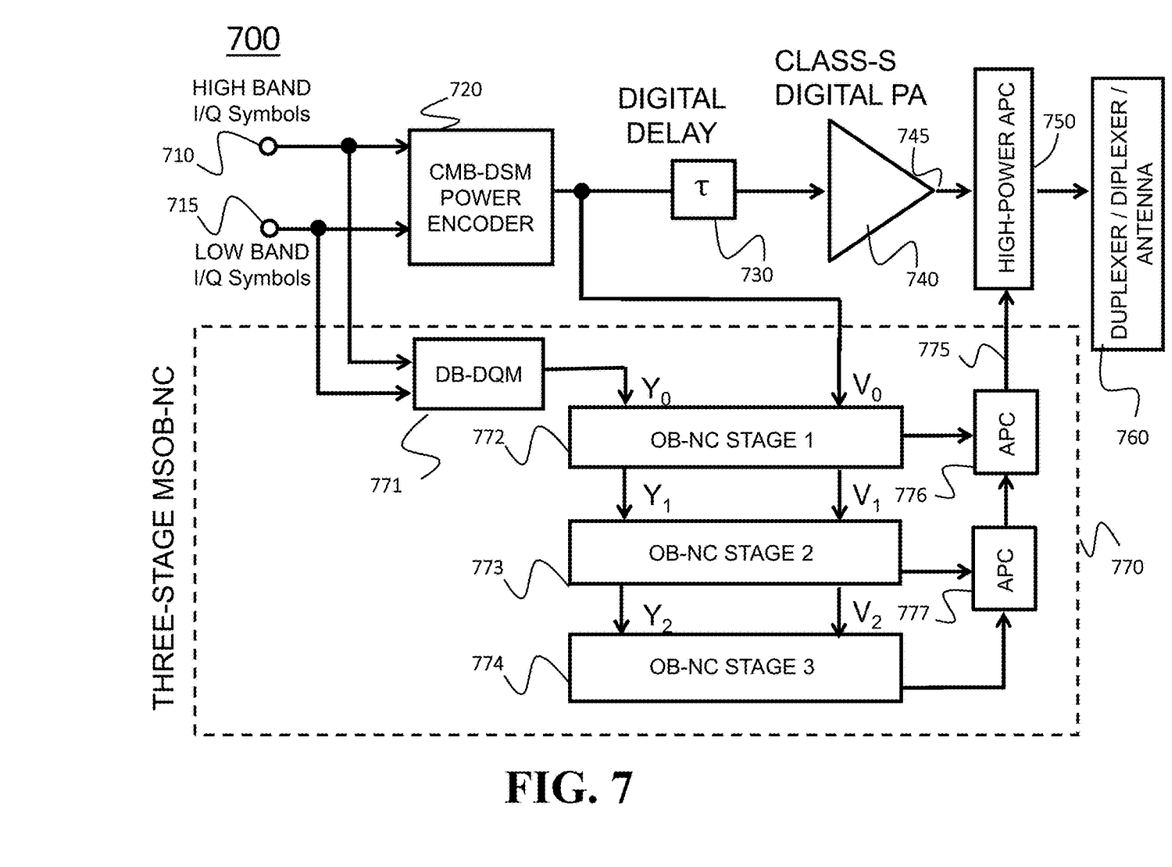
FIG. 7 is a three-stage implementation of MSOB-NC, according to embodiments of the present disclosure.

FIG. 7 shows a block diagram of an IB-CA DTX 700 including a three-stage MSOB-NC 770, according to the embodiments of the present disclosure.

The IB-CA DTX 700 includes a CMB-DSM power encoder 720, a digital delay unit 730, a main class-S digital PA 740, a main high-power asymmetric power combiner (high-power APC) 750 and a duplexer/diplexer antenna 760. The three-stage MSOB-NC 770 includes a dual-band digital quadrature modulator (DB-DQM) 771, a first-stage OB-NC 772, a second-stage OB-NC 773, a third OB-NC 774, a first low-power APC 776 and a second low-power APC 777.

When each OB-NC in the three-stage MSOB-NC 770 has an N-bit quantizer (not shown), as the number of OB-NC stages increases by one, it can be estimated that the out-of-band emission due to quantization noise is suppressed by 6N dB. For example, when a 2-bit quantizer is used, 12-dB additional suppression on the out-of-band quantization noise can be obtained as an additional OB-NC stage is added. The digital delay unit 730 is tuned such that the noise cancellation signal 775 from the three-stage MSOB-NC is aligned with the output 745 of the class-S DPA 740. As the number of OB-NC stages increases, the digital delay 730 is selected to add extra time delay for the synchronization. Therefore, the following relation (1) holds for the digital delay τ before the main class-S DPA 740, the digital delay $\tau_1$ of the first stage OB-NC, the digital delay $\tau_2$ of the second stage OB-NC, and the digital delay $\tau_3$ of the third stage OB-NC.

$$\tau_3 < \tau_2 < \tau_1 < \tau \quad (1)$$

In this case, the first stage OB-NC 772 includes a first stage digital delay unit (not shown) to align an output signal of the first stage OB-NC 772 and an output signal of the APC 776 at the APC 776. Further, the second OB-NC 773 includes a second stage digital delay unit (not shown) to align an output signal of the second stage OB-NC 773 and an output signal of the third OB-NC 774 at the APC 777.

According to embodiments of the present invention, this relation can be extended to a MSOB-NC with more than three stages. With an IB-CA DTX based on CMB-DSM in FIG. 1, the MRFOF 150 may introduce a significant insertion loss. Therefore, one method of determining the number of stages with MSOB-NC is to choose the minimum number of stages, which provides sufficient cancellation of the out-of-band emission at the output of the main high-power APC 750 and thus MRFOFs are not necessary.

In some cases, to determine such a minimum number of MSOB-NC stages, the quantizer resolution can be predetermined. One method to determine the quantizer resolution is to choose the maximum quantizer resolution such that a given system power budget can be satisfied. When the oversampling rate of a CMB-DSM is given, increasing one bit resolution may need to quadruple the power consumption of a digital-to-analog converter (DAC), which interfaces the quantizer output to a low-power PA generating a noise cancellation signal.

According to embodiments of the present disclosure, it is feasible to eliminate the need of using a DAC to drive a Class-AB low-power PA for noise cancellation. In this case, the low-power PA itself can be implemented as another class-S DPA. Because MSOB-NC for IB-CA DTX requires a very wide bandwidth, the resolution of the low-power class-S DPA is also limited, but the resolution can be higher than the resolution of the main high-power class-S DPA.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A radio frequency (RF) transmitter for wireless communication, comprising:
   a plurality of input ports to receive a plurality of sequences of baseband symbols to be transmitted on a plurality of disjoint frequency bands;
   a power encoder to modulate and encode the plurality of sequences of baseband symbols to produce an encoded multi-band signal including the plurality of disjoint frequency bands carrying the plurality of sequences of baseband symbols;
   a first power amplifier for amplifying the encoded multi-band signal to produce an amplified encoded multi-band signal;
   a first noise canceller to generate a first noise mitigation signal from the encoded multi-band signal and the plurality of sequences of baseband symbols, wherein the first noise canceller comprises a first digital adder, wherein the first digital adder transforms the encoded multi-band signal into an opposite signed encoded multi-band signal having an opposite sign by an inverse operation and combines the opposite signed encoded multi-band signal with the plurality of sequences of baseband symbols;
   a first power combiner to combine the amplified encoded multi-band signal and the first noise mitigation signal to produce an RF multi-band signal; and
   an antenna for transmitting the RF multi-band signal.

2. The RF transmitter of claim 1, wherein a first digital delay unit is disposed between the power encoder and the first power amplifier to align the amplified encoded multi-band signal and the first noise mitigation signal at the first power combiner.

3. The RF transmitter of claim 2, wherein the first digital delay unit applies a predetermined delay time to the encoded multi-band signal for compensating the predetermined delay time caused in the first noise canceller.

4. The RF transmitter of claim 1, wherein the first power combiner is an asymmetry power combiner to combine the amplified encoded multi-band signal and the first noise mitigation signal, wherein a power level of the amplified encoded multi-band signal and a power level of the first noise mitigation signal are different.

5. The RF transmitter of claim 1, wherein the first noise canceller comprises a digital gain unit and a coarse quantizer connected to the digital gain unit, wherein the digital gain unit controls an output of a dual-band quadrature modulator in a predetermined input range of the coarse quantizer for avoiding data overflow, wherein the coarse quantizer quantizes an output signal of the first digital adder.

6. The RF transmitter of claim 5, wherein the first noise canceller comprises a second power amplifier, wherein the second power amplifier amplifies an output signal of the coarse quantizer, wherein an output power of the second power amplifier is lower than an output power of the first power amplifier.

7. The RF transmitter of claim 6, wherein a resolution of the second power amplifier is greater than a resolution of the first power amplifier.

8. The RF transmitter of claim 1, further comprising:
   a dual-band quadrature modulator connected to the first digital adder to modulate the plurality of sequences of baseband symbols into a predetermined carrier frequency signal using a digital up-conversion mixing method.

9. The RF transmitter of claim 1, wherein the noise canceller reduces a noise signal caused from the power encoder.

10. The RF transmitter of claim 1, wherein the noise mitigation signal includes an opposite signed noise component of a noise signal caused from the power encoder.

11. The RF transmitter of claim 1, further comprising:
   a second noise canceller to generate a second noise mitigation signal, wherein the second noise mitigation signal is generated using the first noise canceller; and
   a second power combiner to combine the first noise mitigation signal and the second noise mitigation signal.

12. The RF transmitter of claim 11, further comprising:
a third noise canceller to generate a third noise mitigation signal, wherein the third noise mitigation signal is generated using the second noise canceller; and
a third power combiner to combine the second noise mitigation signal and the third noise mitigation signal.

13. A noise mitigation device for generating a noise mitigation signal comprising:
a dual-band quadrature modulator to modulate a plurality of sequences of baseband symbols into a predetermined carrier frequency signal using digital up-conversion mixing;
a first digital adder to combine the predetermined carrier frequency signal and an encoded multi-band signal including a plurality of disjoint frequency bands carrying the plurality of sequences of baseband symbols and generate a first combined signal, wherein the first digital adder transforms the encoded multi-band signal into an opposite signed encoded multi-band signal having an opposite sign by an inverse operation before combining with the predetermined carrier frequency signal;
a first digital gain unit to control the first combined signal of the first digital adder in a predetermined output range;
a first coarse quantizer to quantize the first combined signal from the first digital gain unit into a first quantized signal having first predetermined bits; and
a first power amplifier to amplify the first quantized signal and transmit the amplified first quantized signal as a first noise mitigation signal.

14. The noise mitigation device of claim 13, further comprising:
a first digital delay unit disposed between the first coarse quantizer and the first power amplifier, wherein the first digital delay unit adds a predetermined delay time to the first quantized signal;
a second-stage noise canceller to generate a second noise mitigation signal,
wherein the second-stage noise canceller comprises:
a second digital adder to combine an output signal of the first digital gain unit and the first quantized signal and to generate a second combined signal;
a second digital gain unit to control the second combined signal from the first digital adder in a second predetermined output range;
a second coarse quantizer to quantize the second combined signal from the second digital gain unit into a second quantized signal having second predetermined bits;
a second power amplifier to amplify the second quantized signal and transmit the amplified second quantized signal as a second noise mitigation signal; and
an asymmetric power combiner to combine the first and second noise mitigation signals.

15. The noise mitigation device of claim 14, wherein an output power of the second power amplifier is lower than an output power of the first power amplifier.

* * * * *